(12) United States Patent
Huang et al.

(10) Patent No.: US 10,892,603 B2
(45) Date of Patent: Jan. 12, 2021

(54) ARRAYED WAVEGUIDE GRATING BEAM COMBINER

(71) Applicants: Robin Huang, Littleton, MA (US); Mike Cruz, Wakefield, MA (US); Jeff Shattuck, Methuen, MA (US); Dan Dugmore, North Reading, MA (US)

(72) Inventors: Robin Huang, Littleton, MA (US); Mike Cruz, Wakefield, MA (US); Jeff Shattuck, Methuen, MA (US); Dan Dugmore, North Reading, MA (US)

(73) Assignee: Forward Photonics, LLC, Woburn, MA (US)

( * ) Notice: Subject to any disclaimer, the term of this patent is extended or adjusted under 35 U.S.C. 154(b) by 0 days.

(21) Appl. No.: 16/289,114

(22) Filed: Feb. 28, 2019

(65) Prior Publication Data

US 2019/0267776 A1    Aug. 29, 2019

Related U.S. Application Data

(60) Provisional application No. 62/636,808, filed on Feb. 28, 2018.

(51) Int. Cl.
| | | |
|---|---|---|
| *H01S 5/40* | (2006.01) | |
| *G02B 27/10* | (2006.01) | |
| *G02B 6/12* | (2006.01) | |
| *H01S 5/34* | (2006.01) | |
| *H01S 5/028* | (2006.01) | |
| *H01S 5/14* | (2006.01) | |

(52) U.S. Cl.
CPC ........ *H01S 5/4012* (2013.01); *G02B 6/12009* (2013.01); *G02B 27/1086* (2013.01); *H01S 5/028* (2013.01); *H01S 5/3402* (2013.01); *H01S 5/4062* (2013.01); *H01S 5/4087* (2013.01); *H01S 5/141* (2013.01); *H01S 5/4068* (2013.01)

(58) Field of Classification Search
CPC ............ G02B 6/12009; G02B 27/1086; G02B 27/10; G02B 6/12; H01S 5/4087; H01S 5/4062; H01S 5/34; H01S 5/14; H01S 5/40; H01S 5/4012
See application file for complete search history.

(56) References Cited

U.S. PATENT DOCUMENTS

| | | | | |
|---|---|---|---|---|
| 4,878,724 A | * | 11/1989 | Thaniyavarn | ......... H01S 5/4025 385/3 |
| 6,055,250 A | * | 4/2000 | Doerr | ...................... H01S 5/026 372/23 |
| 8,228,960 B2 | * | 7/2012 | Furukawa | ............. H01S 5/4062 372/22 |
| 8,902,944 B2 | * | 12/2014 | Pezeshki | ............... H01S 5/4087 372/38.02 |

(Continued)

FOREIGN PATENT DOCUMENTS

EP    1788678 A1    5/2007

*Primary Examiner* — Tuan N Nguyen
(74) *Attorney, Agent, or Firm* — Danielson Legal LLC

(57) ABSTRACT

Systems and methods for producing a multi-wavelength beam, wherein the system comprises a laser array and an arrayed waveguide grating having an input end and an output end, wherein the input end has an anti-reflection coating, the input end is configured to receive light from the laser array, and the output end has a reflective coating configured to reflect feedback to the laser array.

20 Claims, 3 Drawing Sheets

(56) References Cited

U.S. PATENT DOCUMENTS

| | | | | |
|---|---|---|---|---|
| 2003/0011840 A1* | 1/2003 | Mitra | ............... | H01S 3/2383 |
| | | | | 398/79 |
| 2008/0310470 A1* | 12/2008 | Ooi | ............... | H01S 5/341 |
| | | | | 372/44.01 |
| 2014/0133511 A1* | 5/2014 | Tanaka | ............... | H01S 5/1032 |
| | | | | 372/50.11 |
| 2015/0293301 A1 | 10/2015 | Huang | | |

* cited by examiner

ARRAYED WAVEGUIDE GRATING BEAM COMBINER

CROSS REFERENCE TO RELATED APPLICATIONS

The present application claims priority to U.S. provisional application No. 62/636,808, filed Feb. 28, 2018, the entire disclosure of which is hereby incorporated by reference as if set forth in its entirety herein.

TECHNICAL FIELD

Embodiments relate generally to a system and method for producing a multi-wavelength beam, and more specifically to methods and systems using an arrayed waveguide grating and a laser array to produce a multi-wavelength beam.

BACKGROUND

High-power laser systems with high beam quality are used for a host of different applications, such as materials processing, defense, remote sensing, LADAR, displays, and medical lasers. Such laser systems typically include a laser emitter, the laser light from which is coupled into an optical fiber, and an optical system that focuses the laser light from the fiber on a workpiece to be processed.

In many constrained platforms, lasers may be selected for their low size, weight, and power. In the current commercial market, semiconductor lasers offer a combination of compactness of high efficiency, with commercial grade diode lasers at 9xx nm wavelength demonstrating greater than 65% power conversion efficiency ("PCE") and research grade diodes at the same wavelength range demonstrating greater than 75% PCE. However, with currently available technology, the power in a single mode from a single emitter diode laser is often limited to a few watts, depending on wavelength.

Such laser systems typically include a laser emitter, the laser light from which is coupled into an optical fiber (or simply a "fiber"), and an optical system that focuses the laser light from the fiber onto the workpiece to be processed. The optical system is typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). The BPP quantifies the quality of the laser beam and how well it can be focused to a small spot. The BPP is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted M2, or the "beam quality factor," which is a wavelength-independent measure of beam quality, with the "best" quality corresponding to the "lowest" beam quality factor of 1.

Beam combining technologies have proven to be very successful at scaling power in a single mode. Wavelength beam combining (WBC) is a technique for scaling the output power and brightness from laser diode bars, stacks of diode bars, or other lasers arranged in one- or two-dimensional arrays. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, U.S. Pat. No. 8,559,107, filed on Mar. 7, 2011, U.S. patent application Ser. No. 14/681,136, filed on Apr. 8, 2015, the entire disclosure of each of which is incorporated by reference herein.

Drawbacks of the currently available beam combining technologies include a large size due to the use of bulk optics and the requirement of a large distance between each optic, greatly increasing the size of the laser. For example, an industrial beam combined 4-kW diode laser with high beam quality is typically 1-meter cubed in dimension, while 4-kW diode bar stacks with low beam quality are typically 1-inch cubed in dimension. Moreover, in WBC resonators there is an inverse relationship between the optical path length of the laser resonator and the bandwidth of the output. In WBC resonators, as the bandwidth decreases, the size of the laser module increases. For a laser with a bandwidth as narrow as 0.5 nm, even for a single bar the required size of the laser resonator can become prohibitively large.

A need exists, therefore, for systems, methods, and devices that overcome these disadvantages.

SUMMARY

This summary is provided to introduce a selection of concepts in a simplified form that are further described below in the Detailed Description. This summary is not meant or intended to identify or exclude key features or essential features of the claimed subject matter, nor is it intended to be used as an aid in determining the scope of the claimed subject matter.

In one aspect, embodiments relate to a wavelength beam combination system. In some embodiments, the system includes a laser array and an arrayed waveguide grating having an input end and an output end, wherein the input end has an anti-reflection coating, the input end is configured to receive light from the laser array, and the output end has a reflective coating configured to reflect feedback to the laser array.

In some embodiments, the laser array is a laser diode.

In some embodiments, the laser array has a second anti-reflection coating.

In some embodiments, the arrayed waveguide grating is a multiplexer arrayed waveguide grating.

In some embodiments, the system is configured to produce a multi-wavelength light beam.

In some embodiments, the system is configured to produce a single-mode, multi-wavelength light beam.

In some embodiments, the beam has a power output of less than 10 watts.

In some embodiments, the laser array is a single mode emitter.

In some embodiments, the laser array has an adjustable current.

In some embodiments, the laser array has a pitch and the arrayed waveguide grating has input waveguides spaced with the same pitch as the laser array.

In another aspect, embodiments relate to a method of producing a multi-wavelength beam. In some embodiments, the method includes emitting a light beam from a first output end of a laser array, the laser array having a first input end and the first output end, receiving the light beam at a second input end of an arrayed waveguide grating, the second input end having an anti-reflection coating, outputting the multi-wavelength beam at a second output end of the arrayed waveguide grating, the second output end having a reflective coating, outputting feedback at the arrayed waveguide grating, and directing the feedback to the first input end of the laser array.

In some embodiments, the laser array is a laser diode.

In some embodiments, the laser array has a second anti-reflection coating.

In some embodiments, the arrayed waveguide grating is a multiplexer arrayed waveguide grating.

In some embodiments, the multi-wavelength beam is a single-mode multi-wavelength light beam.

In some embodiments, the multi-wavelength beam has a power output of less than 10 watts.

In some embodiments, the laser array is a single mode emitter.

In some embodiments, the laser array has an adjustable current.

In some embodiments, wherein the laser array has a pitch and the arrayed waveguide grating has input waveguides spaced with the same pitch as the laser array.

In some embodiments, the laser array is a quantum cascade laser.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Various embodiments are described more fully below with reference to the accompanying drawings, which form a part hereof, and which show specific exemplary embodiments. However, the concepts of the present disclosure may be implemented in many different forms and should not be construed as limited to the embodiments set forth herein; rather, these embodiments are provided as part of a thorough and complete disclosure, to fully convey the scope of the concepts, techniques and implementations of the present disclosure to those skilled in the art. Embodiments may be practiced as methods, systems or devices. Accordingly, embodiments may take the form of a hardware implementation, an entirely software implementation or an implementation combining software and hardware aspects. The following detailed description is, therefore, not to be taken in a limiting sense.

Reference in the specification to "one embodiment" or to "an embodiment" means that a particular feature, structure, or characteristic described in connection with the embodiments is included in at least one example implementation or technique in accordance with the present disclosure. The appearances of the phrase "in one embodiment" in various places in the specification are not necessarily all referring to the same embodiment.

In addition, the language used in the specification has been principally selected for readability and instructional purposes and may not have been selected to delineate or circumscribe the disclosed subject matter. Accordingly, the present disclosure is intended to be illustrative, and not limiting, of the scope of the concepts discussed herein.

Embodiments provide a wavelength beam combination system with an arrayed waveguide grating as the dispersive element in the external cavity and a method for using such a system. In some embodiments, the diffraction grating and the transform lens of a traditional wavelength beam combination system are replaced by an arrayed waveguide grating, notionally passive planar light wave circuits fabricated to provide constructive and deconstructive interference of light coupled to the input waveguides of the arrayed waveguide grating.

Figure 1:
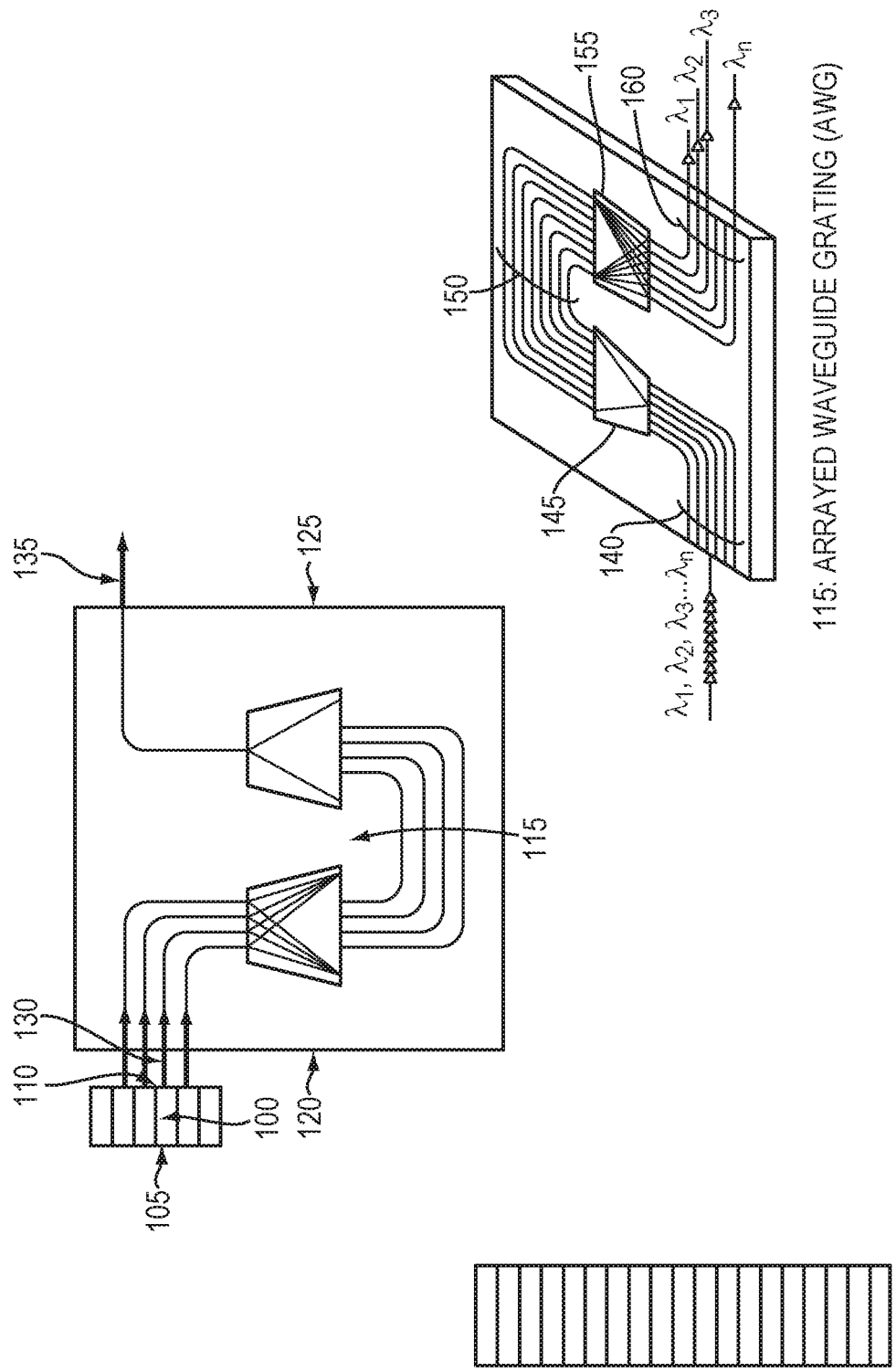
FIG. 1 illustrates a system of a wavelength beam combination system with an arrayed waveguide grating, in accordance with one embodiment.

FIG. 1 illustrates a wavelength beam combination system with an arrayed waveguide grating, in accordance with one embodiment. In some embodiments, a laser array input 100 may produce input beams 130. In some embodiments, multiple inputs 100 may be present in the system. In some embodiments, the laser array input 100 may be a diode laser array as shown in FIG. 1, a semiconductor laser array, or a bar. In some embodiments, the laser array input 100 may be a single-mode laser array input 100 or a multi-mode laser array input 100. In some embodiments, the laser array input 100 may comprise a plurality of single- and multi-mode inputs.

In some embodiments, the input beams 130 outputted by the laser array input 100 are directed to the arrayed waveguide grating 115. The arrayed waveguide grating 115 serves as a multiplexing beam combiner wherein the input beams 130 are processed and outputted as a multi-wavelength output beam 135 in some embodiments. The arrayed waveguide grating 115 may combine the input beams 130 such that the output beam 135 is a spatially overlapping single output beam with multiple wavelengths. Although an arrayed waveguide grating may be used as a demultiplexer, wherein the device creates a dispersion of a beam combining multiple wavelengths, the arrayed waveguide grating in the embodiment shown in FIG. 1 operates as a multiplexer, wherein the beams 130 with multiple wavelengths are combined to an output beam 135.

In some embodiments, the arrayed waveguide grating 115 may contain an input waveguide where the input beams 130 may enter the arrayed waveguide grating. The input beams 130 may travel through input channels in the input slab waveguide 145, wherein the input slab waveguide 145 and the input waveguide 140 are configured to receive light of a specified wavelength. Specifically, the input slab waveguide 145 in some embodiments may be configured to interfere with the input beams 130 traveling through the input waveguides 140. The arrayed waveguides 150 allow the input beams 130 to travel through a free space toward the output slab waveguide 155 in some embodiments. In some embodiments the output slab waveguide 155 and the output waveguide 160 act as a channel to direct the light and combine the light into at least one multi-wavelength output beam 135. In some embodiments, after the light from the input beams 130 has been combined into at least one multi-wavelength output beam 135, the output beam 135 may exit the arrayed waveguide grating 115 and may be emitted as a multi-wavelength output beam 135.

In some embodiments, components of the arrayed waveguide grating 115 may be made of at least one of glass, diamond, indium phosphide, silicon, silicon nitride, germanium, fused silica, or quartz. In some embodiments, components of the arrayed waveguide grating 115 are made of a composite of materials, wherein at least one composite material includes glass, diamond indium phosphide, silicon, silicon nitride, germanium, fused silica, or quartz.

In some embodiments, the laser array input 100 may be coated in a reflective coating 105. Examples of materials used for these types of reflective coatings include, but are not limited to Silicon Dioxide ($SiO_2$), Titanium Dioxide ($TiO_2$), Tantalum Pentoxide ($Ta_2O_5$), Aluminum Oxide ($Al_2O_3$), and others. The design of the reflective coating can involve one, two, or more layers of these types of materials or other materials. These coatings may be deposited by, for example, electron beam evaporation, ion-assisted electron-beam evaporation, or by other methods. In some embodiments, part of the laser array input 100 may be coated in an anti-reflection coating 110. In some embodiments, the anti-reflection coating 110 is located at the point where the input beams 130 are outputted by the laser array input 100.

In some embodiments, a single mode emitter bar may be used as the laser array input 100. In some embodiments, the single mode emitter bar may have a power level of up to 150 W. In some embodiments, the single mode emitter bar may have a power level of up to 200 W. In some embodiments, the laser array input 100 may have a peak efficiency of up to 60% at around 1 micron wavelength. In some embodiments, the laser array input 100 may include approximately 200 single mode emitters per one centimeter of bar. In some embodiments, the arrayed waveguide grating 115 may be made of glass. In some embodiments, where the arrayed waveguide grating 115 has at least one glass component, the power may need to be reduced to 10 W. In some embodiments, the arrayed waveguide grating 115 may determine the wavelength of the output beam 135 produced. In some embodiments, by using different types of glasses or substrates, the wavelength range may be extended from ultraviolet to long wavelength infrared ranges. In some embodiments the current can be reduced or increased to produce different output beams 135. In some embodiments, the arrayed waveguide grating 115 is 2 cm in length and 1.5 cm in width.

In some embodiments, the arrayed waveguide grating 115 may be coated with a partially reflective coating 125. In some embodiments, the output facet of the arrayed waveguide grating 115 is coated with a partially reflective dielectric coating on about 10% of the arrayed waveguide grating 115. In some embodiments, the material of the arrayed waveguide grating 115 has a natural reflectance at the interface with air. In some embodiments, this natural reflectance is dependent on the index difference.

In some embodiments, the laser array input 100 may include a high reflective coating 105 on one end of the wavelength beam combination system. In some embodiments, the laser array input 100 may be an array of semiconductor laser elements. In some embodiments, the array may be an array of laser diodes, quantum cascade lasers, interband cascade lasers, or other laser elements. In some embodiments, the elements of the laser array input 100 may be identical and may have similar output spectral content. In some embodiments, each laser element of the laser array input 100 is not specialized.

In some embodiments, the anti-reflection coating 110 at the laser array input 100 may inhibit laser performance in the absence of the external resonator and may simultaneously increase transmission of the input beams 130 into the arrayed waveguide grating 115. In some embodiments, the anti-reflection coating may reduce transmission loss into the waveguides of the arrayed waveguide grating 115. In some embodiments, the laser array input 100 may be closely coupled to the arrayed waveguide grating 115 such that the anti-reflection coating 110 may not be used. In some embodiments, the arrayed waveguide grating 115 may also be coated in an anti-reflection coating 120 to reduce transmission loss into the waveguides of the arrayed waveguide grating and increase transmission of the input beams 130 into the arrayed waveguide grating 115. In some embodiments, the anti-reflection coating 120 is placed on the input side of the arrayed waveguide grating and away from the input waveguide.

In some embodiments, the arrayed waveguide grating 115 may have input waveguides spaced with the same pitch as the laser array input 100. In some embodiments, the input waveguides may be spaced between 20 μm and 1 mm.

Figure 2:
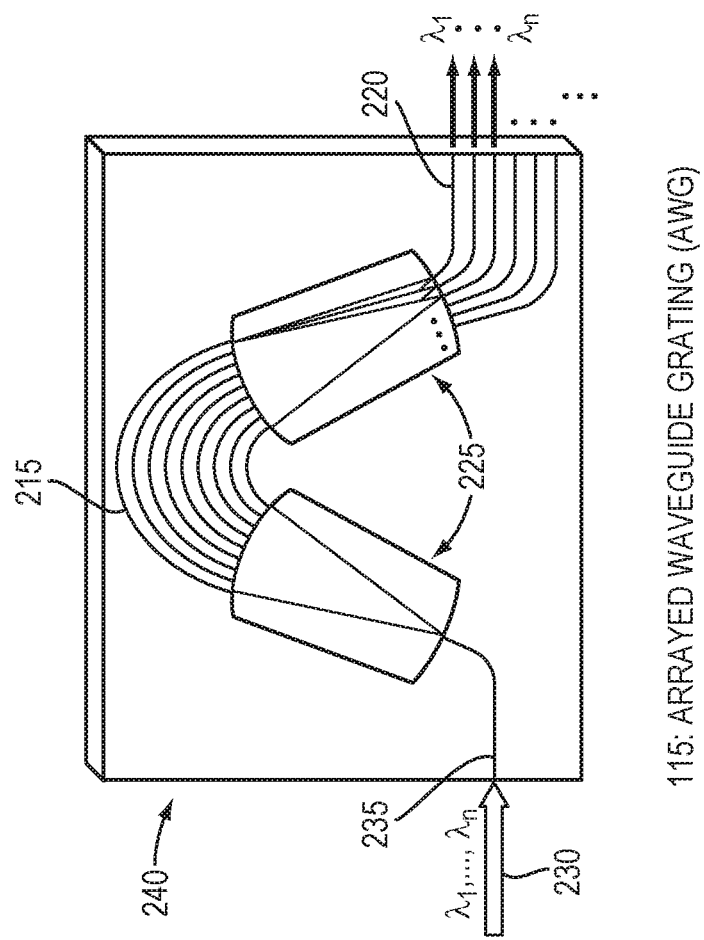
FIG. 2 illustrates an arrayed waveguide grating, in accordance with one embodiment.
Figure 2:
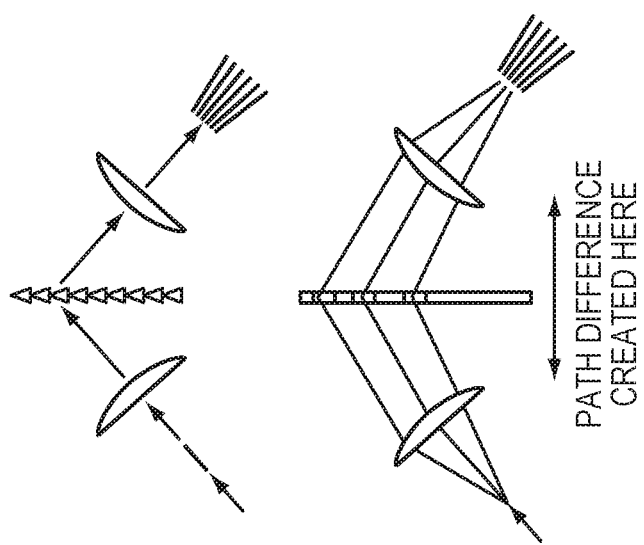

FIG. 2 illustrates an arrayed waveguide grating 115 in accordance with one embodiment. In some embodiments, the arrayed waveguide grating 115 may be coupled to the laser array input 100. In some embodiments, the arrayed waveguide grating 115 may have two free propagation regions 225. In some embodiments, the input waveguide 235 may direct light 230 as an input fiber feed to the first free propagation region 25. In some embodiments, the first free propagation region 225 may be an input slab waveguide. The free propagation regions 225 may allow light 230 from each input waveguide 235 to mix. In some embodiments, the light from the input waveguides 235 may then be directed to an array of waveguides 215. The array of waveguides 215 may comprise a plurality of waveguides, each with a selected length difference. In some embodiments, the array of waveguides 215 may guide the light 230 to a second free propagation region 225. In some embodiments, the second free propagation region 225 may be an output slab waveguide. In some embodiments, the output slab waveguide may allow light to mix and may guide the light into the output waveguides 220. In some embodiments, the output waveguide 220 is a single output port. In some embodiments, the output waveguide 220 of the arrayed waveguide grating may serve as an output coupler at the other end of the wavelength beam combination system.

In some embodiments, light may reflect off the output waveguide 220 and may traverse back through the arrayed waveguide grating 115 back to the laser array input 100. In some embodiments, the light reflected off the output waveguide 220 may traverse back when the light has a specified wavelength-to-position relationship that does not match the settings of the output wavelength guide for producing the output beam 135. The reflected light may be referred to as feedback. When the feedback is transmitted back to the active region of the input, the feedback may seed the laser transmission and narrow the laser spectral output. In some embodiments, this creates a path difference which may result in an output spectrum described in further detail in FIG. 3.

In some embodiments, the input beams 130 may be collected by an array of microlenses. In some embodiments, the array of microlenses may collimate the rapidly diverging light from the laser array input 100. In some embodiments, the input beams 130 may then be refocused by a second microlens array and imaged onto the anti-reflection coated facet of the arrayed waveguide grating 115. In some embodiments, asymmetrical magnification may be used to match the mode of the arrayed waveguide grating to input beams from the laser array input 100.

In some embodiments, the output of the arrayed waveguide grating may be coated in an anti-reflection coating. In some embodiments where the output of the arrayed waveguide grating is coated in an anti-reflection coating, the output coupler of the wavelength beam combination system may be moved off the chip 240. In some embodiments, multiple arrayed waveguide gratings 115 in the cavities of the wavelength beam combination system may have a co-boresighted output. In some embodiments, the cavity in the wavelength beam combination system may require the output beams of any of its constituent cavities to be spatially overlapping. In some embodiments, active semiconductor laser waveguides and passive arrayed waveguide grating waveguides may be patterned on one chip 240. In some embodiments, the arrayed waveguide grating guides are patterned on a photonic chip 240.

Figure 3:
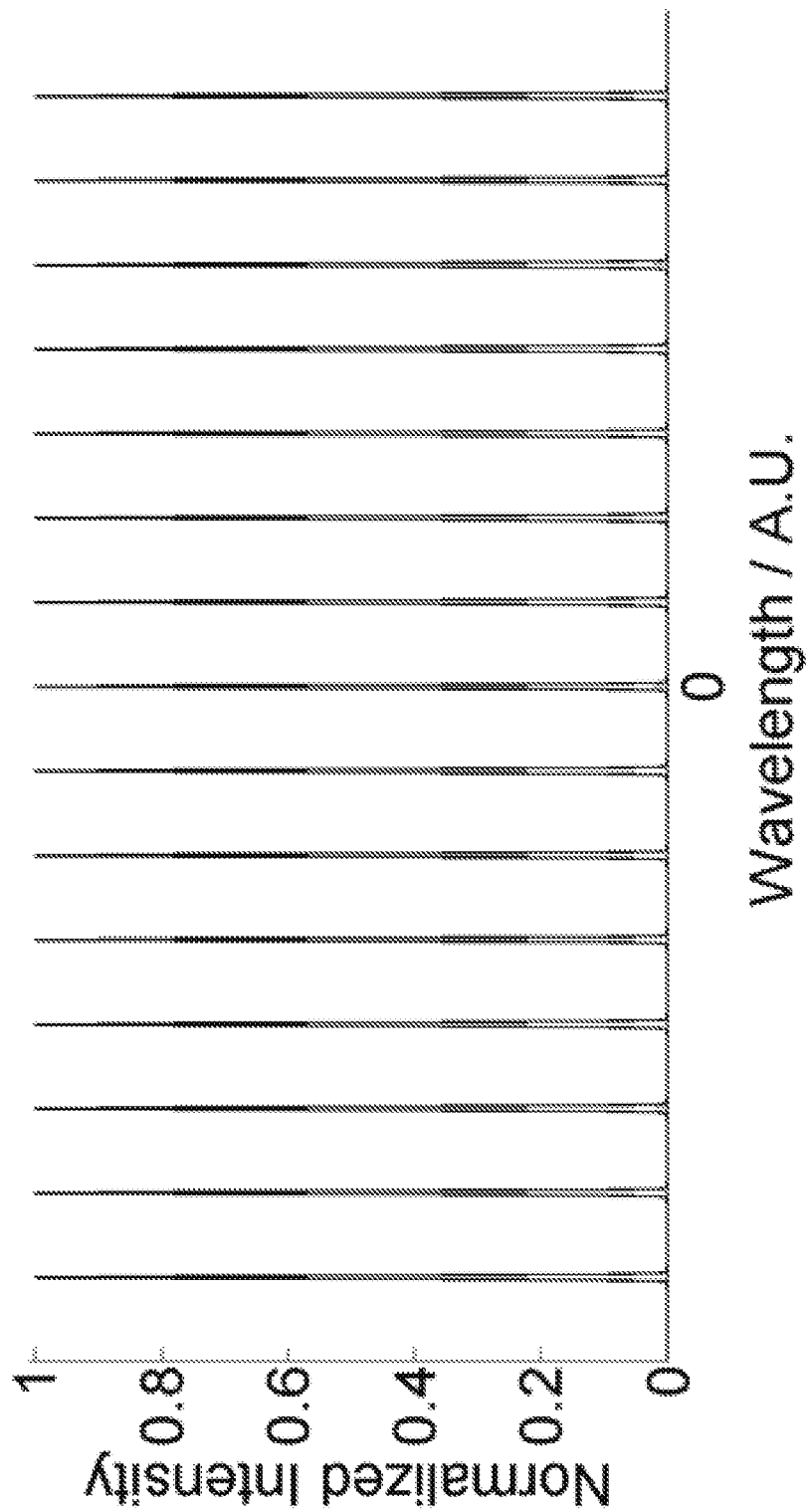
FIG. 3 is a generic spectrum of an output of the wavelength beam combination system with an arrayed waveguide grating, in accordance with one embodiment.

FIG. 3 is a generic spectrum of an output of the wavelength beam combination system with an arrayed waveguide grating in accordance with one embodiment. In some embodiments, each laser at the laser array input has a narrowed spectral output with center wavelength shifted from other elements. This may allow for power scaling of the resultant output beam. In some embodiments, the arrayed waveguide grating spatially combines the plurality of beams into a single output beam with wavelengths across the spectrum of FIG. 3.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Having described several example configurations, various modifications, alternative constructions, and equivalents may be used without departing from the spirit of the disclosure. For example, the above elements may be components of a larger system, wherein other rules may take precedence over or otherwise modify the application of various implementations or techniques of the present disclosure. Also, a number of steps may be undertaken before, during, or after the above elements are considered.

Having been provided with the description and illustration of the present application, one skilled in the art may envision variations, modifications, and alternate embodiments falling within the general inventive concept discussed in this application that do not depart from the scope of the following claims.

What is claimed is:

1. A wavelength beam combination system, the wavelength beam combination system comprising:
    a laser array, the laser array having an active region and a passive region; and
    an arrayed waveguide grating having an input end, an output end, at least one slab waveguide between the input end and the output end, and an output waveguide between the at least one slab waveguide and the output end, wherein:
        the input end has a first anti-reflection coating;
        the input end is configured to receive light from the laser array;
        the light is configured to travel from the input end, through the slab waveguide, and into the output waveguide;
        the output waveguide is configured to separate the light into at least one output beam and at least one feedback beam;
        the output end has a reflective coating configured to reflect the feedback beam from the output end through the arrayed waveguide grating, the feedback beam comprising light not matching a set output wavelength to the active region of the laser array;
        the feedback beam is configured to seed a transmission inside the active region of the laser array after at least twice passing through the arrayed waveguide grating, the at least one slab waveguide, and the input end;
        the transmission is configured to narrow a laser spectral output of a light beam emitted from the laser array; and
        the arrayed waveguide grating is butt-coupled to the laser array.

2. The wavelength beam combination system of claim 1 wherein the laser array is a laser diode.

3. The wavelength beam combination system of claim 1 wherein the laser array has a second anti-reflection coating.

4. The wavelength beam combination system of claim 1 wherein the arrayed waveguide grating is a multiplexer arrayed waveguide grating.

5. The wavelength beam combination system of claim 1 wherein the at least one output beam and the at least one feedback beam comprise an array of narrowed spectral outputs, each narrowed spectral output having a center wavelength shifted from the center wavelength of other light beams of the laser array.

6. The wavelength beam combination system of claim 1 wherein the wavelength beam combination system is configured to produce a single-mode, multi-wavelength light beam.

7. The wavelength beam combination system of claim 6 wherein the single-mode, multi-wavelength light beam has a power output of less than 10 watts.

8. The wavelength beam combination system of claim 1 wherein the laser array is a single mode emitter.

9. The wavelength beam combination system of claim 1 wherein the laser array has an adjustable current.

10. The wavelength beam combination system of claim 1 wherein the laser array has a pitch and the arrayed waveguide grating has input waveguides spaced with the same pitch as the laser array.

11. A method of producing a multi-wavelength beam, the method comprising:

emitting a light beam, the light beam having a laser spectral output, from a first output end of a laser array, the laser array having an active region and a passive region;

receiving the light beam at an input end of an arrayed waveguide grating, the input end having a first anti-reflection coating;

directing the light beam through the arrayed waveguide grating;

directing the light beam through a first slab waveguide;

directing the light beam through a second slab waveguide;

directing the light beam into an output waveguide between the second slab waveguide and a second output end of the arrayed waveguide grating;

separating a feedback beam from the multi-wavelength beam;

outputting the multi-wavelength beam matching an output wavelength at the second output end of the arrayed waveguide grating, the second output end having a reflective coating;

reflecting a feedback beam through the arrayed waveguide grating, the second slab waveguide, and the first slab waveguide, the feedback beam comprising light not matching the output wavelength;

directing the feedback beam from the second input end to the active region of the laser array;

seeding, with the feedback, a transmission inside the active region of the laser array; and narrowing, with the transmission, the laser spectral output.

12. The method of claim 11 wherein the laser array is a laser diode.

13. The method of claim 11 wherein the laser array has a second anti-reflection coating.

14. The method of claim 11 wherein the arrayed waveguide grating is a multiplexer arrayed waveguide grating.

15. The method of claim 11 wherein the multi-wavelength beam is a single-mode multi-wavelength light beam.

16. The method of claim 11 wherein the multi-wavelength beam has a power output of less than 10 watts.

17. The method of claim 11 wherein the laser array is a single mode emitter.

18. The method of claim 11, further comprising separating the light between the first slab waveguide and the second slab waveguide into a plurality of light beams, wherein the number of light beams between the first slab waveguide and the second slab waveguide is:

greater than the number of light beams entering the first slab waveguide from the direction of the emitting light beam; and equal to or greater than the number of light beams exiting the second slab waveguide.

19. The method of claim 11 wherein the laser array has a pitch and the arrayed waveguide grating has input waveguides spaced with the same pitch as the laser array.

20. The method of claim 11 wherein the laser array is a quantum cascade laser.

* * * * *